United States Patent
Ambroladze et al.

(10) Patent No.: US 10,529,396 B2
(45) Date of Patent: Jan. 7, 2020

(54) PREINSTALL OF PARTIAL STORE CACHE LINES

(71) Applicant: International Business Machines Corporation, Armonk, NY (US)

(72) Inventors: Ekaterina M. Ambroladze, Los Angeles, CA (US); Sascha Junghans, Ammerbuch (DE); Matthias Klein, Wappingers Falls, NY (US); Pak-Kin Mak, Poughkeepsie, NY (US); Robert J. Sonnelitter, III, Wappingers Falls, NY (US); Chad G. Wilson, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 211 days.

(21) Appl. No.: 15/629,923

(22) Filed: Jun. 22, 2017

(65) Prior Publication Data

US 2018/0374522 A1    Dec. 27, 2018

(51) Int. Cl.
G06F 3/06 (2006.01)
G06F 13/16 (2006.01)
G11C 7/10 (2006.01)
G11C 8/06 (2006.01)

(52) U.S. Cl.
CPC ............. *G11C 8/06* (2013.01); *G06F 3/0659* (2013.01); *G06F 13/1673* (2013.01); *G11C 7/103* (2013.01)

(58) Field of Classification Search
CPC ... G06F 3/0659; G06F 13/1673; G11C 7/103; G11C 8/06
See application file for complete search history.

(56) References Cited

U.S. PATENT DOCUMENTS

| | | | |
|---|---|---|---|
| 5,544,342 A | 8/1996 | Dean | |
| 6,353,877 B1 | 3/2002 | Duncan et al. | |
| 2002/0062409 A1 | 5/2002 | Lasserre et al. | |
| 2008/0209130 A1 | 8/2008 | Kegel et al. | |
| 2010/0268885 A1 | 10/2010 | Frey et al. | |
| 2011/0320743 A1* | 12/2011 | Hagspiel | G06F 12/0815 711/154 |
| 2016/0217077 A1 | 7/2016 | Ambroladze et al. | |
| 2017/0168947 A1* | 6/2017 | Lesecq | G06F 12/0862 |
| 2017/0228189 A1* | 8/2017 | Sudo | G11C 7/1006 |
| 2017/0293560 A1* | 10/2017 | Eckert | G06F 12/0862 |

* cited by examiner

*Primary Examiner* — Aracelis Ruiz

(74) *Attorney, Agent, or Firm* — Cantor Colburn LLP; William Kinnaman

(57) ABSTRACT

A system and method to transfer an ordered partial store of data from a controller to a memory subsystem receives the ordered partial store of data into a buffer of the controller. The method also includes issuing a preinstall command to the memory subsystem, wherein the preinstall command indicates that data from a number of addresses of memory corresponding with a target memory location be obtained in local memory of the memory subsystem along with ownership of the data for subsequent use. A query command is issued to the memory subsystem. The query command requests an indication from the memory subsystem that the memory subsystem is ready to receive and correctly serialize the ordered partial store of data. The ordered partial store of data is transferred from the controller to the memory subsystem.

20 Claims, 4 Drawing Sheets

PREINSTALL OF PARTIAL STORE CACHE LINES

BACKGROUND

The present invention relates to partial store of data, and more specifically, to preinstall of partial store cache lines.

Under certain conditions, a partial store of data is obtained. One such condition involves a system such as a mainframe obtaining data from an input/output (I/O device) through an off-the-shelf Peripheral Component Interface express (PCIe) adapter. The PCIe adapter may be optimized for a different architecture than that of the system. For example, the cache line, which is a set of addresses that represent the optimal granularity of data read or written at a time (i.e., the fixed size of data per transfer), may be 256 bytes for the system and 64 bytes for the PCIe adapter. In this case, the system could send or receive only 64 bytes at a time through the PCIe adapter but can transfer 256 bytes at a time internally. This requires the system to perform a partial store of data within the 256 bytes cache line size, 64 bytes or less at a time, and to correctly serialize the sets of 64 bytes that make up its internal 256 byte cache line. Thus, the exemplary mis-match in cache lines illustrates a case in which partial stores of data and proper serialization of the data are necessary to facilitate correct retrieval of the data.

SUMMARY

According to an embodiment of the present invention, a method of transferring an ordered partial store of data from a controller to a memory subsystem includes receiving the ordered partial store of data into a buffer of the controller, and issuing a preinstall command to the memory subsystem, wherein the preinstall command indicates that data from a number of addresses of memory corresponding with a target memory location be obtained in local memory of the memory subsystem along with ownership of the data for subsequent use. The method also includes issuing a query command to the memory subsystem. The query command requests an indication from the memory subsystem that the memory subsystem is ready to receive and correctly serialize the ordered partial store of data. The ordered partial store of data is transferred from the controller to the memory subsystem.

According to another embodiment of the present invention, a system to transfer an ordered partial store of data includes a controller to receive the ordered partial store of data into a buffer, and issue a preinstall command to a memory subsystem. The preinstall command indicates that data from a number of addresses of memory corresponding with a target memory location be obtained in a local memory of the memory subsystem along with ownership of the data. The controller also issues a query command to the memory subsystem. The query command requests an indication that the memory subsystem is ready to receive and correctly serialize the ordered partial store of data. The controller transfers the ordered partial store data from the buffer to the memory subsystem. The system also includes the memory subsystem to store the ordered partial store of data and transfer the ordered partial store of data to the target memory location.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

Figure 1:
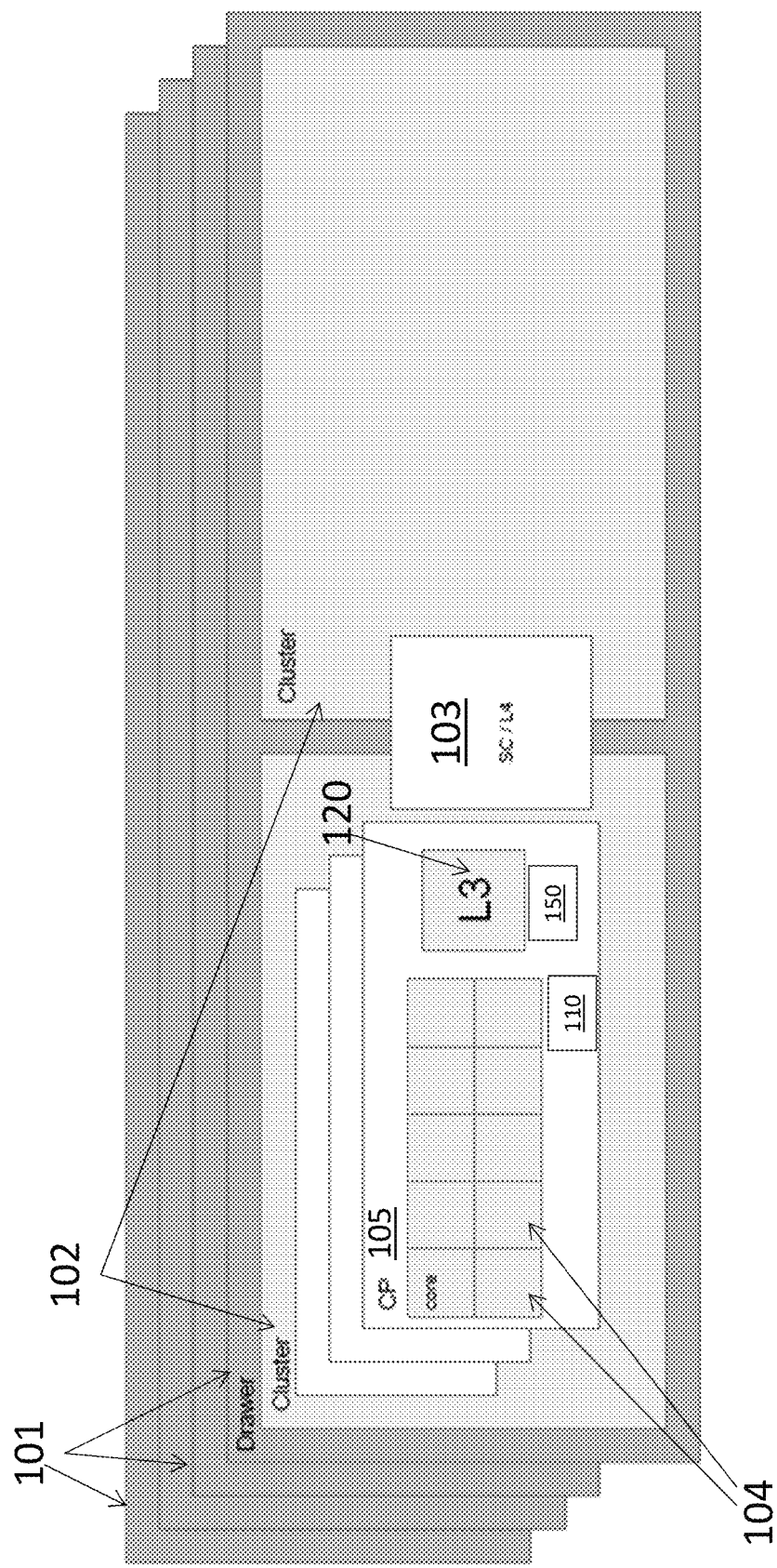
FIG. 1 shows portions of an exemplary mainframe computer configured to perform the preinstall of partial store cache lines according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

As previously noted, there are conditions that require a partial store of data and correct ordering or serialization of the partial stores that make up the entirety of the data. One such condition, which is discussed in detail herein for explanatory purposes, involves a mainframe computer that uses a PCIe adapter with a different size cache line to read from and write to an I/O device. The mainframe computer uses a 256 byte cache line while the PCIe adapter uses a 64 byte cache line, for example. As a result, data transfer between the mainframe computer and the I/O device, via the PCIe adapter, is performed 64 bytes at a time while data transfer within the mainframe computer is performed 256 bytes at a time. This leads to partial stores of data at the PCI Bridge Controller (PBC) of the mainframe computer, which interfaces with the PCIe adapter. The PBC includes buffers to store data that is received 64 bytes at a time from the I/O device through the PCIe adapter. The PBC must ensure correct ordering of the partial stores of data received from the PCIe adapter or being sent through the PCIe adapter. The PBC stores the data to and retrieves the data from a third level cache (L3) of the mainframe computer based on 256 byte cache lines, for example. An originator identifier is used to correctly order the partial stores in the store finite state machines (FSMs) of the PBC.

Specifically, the mainframe computer may have numerous L3 that have access to the same cache lines in memory and can retrieve the data in a given cache line and obtain temporary ownership of the cache line in order to be able to write data. As a result, no L3 can indefinitely retain the data and ownership of a shared cache line. This leads to the need for a given L3 to install a cache line in anticipation of writing data to the cache line. Installation refers to the L3 obtaining the data from the cache line and establishing ownership in order to write.

According to prior approaches, in order to ensure correct ordering of data in the partial stores, the PBC waits for a previous data set to reach a certain state before addressing the next data set. Specifically, the PBC sends a query to the L3 with regard to a cache line (e.g., cache line A). The query includes the address of the cache line (e.g., address of cache line A). This query causes the L3 to obtain 256 bytes of memory (in the exemplary case of a 256 byte cache line) corresponding to the requested cache line into local cache and obtaining ownership in the process previously discussed as installing the cache line. The query command also causes the L3 to prepare to receive data associated with cache line A (e.g., from the PBC) by serializing data on cache line A with respect to existing data. Once the L3 indicates that the local cache is ready to serialize the next cache line, the PBC sends the data and the query for another cache line (e.g., cache line B) as needed. Waiting for the indication from the L3 as part of the query process ensures that the serialization of the data is maintained. However, the fact that a subsequent query is not sent by the PBC until the L3 indicates that it is ready to receive the data associated with the previous query results in slow throughput.

Turning now to an overview of the present invention, one or more embodiments relate to the addition of a preinstall command by the PBC. The PBC sends the preinstall command to the L3 for pending cache lines based on a predefined condition being met, according to one or more embodiments, regardless of the current state of a previous query. The query command causes the L3 to prepare to receive the cache line for storage in the local memory. The query affects serialization and ties up resources such as controllers and state machines of the L3. Unlike the query command, the preinstall command cannot result in potentially necessary resources being tied up. This is because, while the preinstall command results in data from the cache line and ownership being obtained, it does not result in obtaining other resources or retention of ownership until data transfer is complete.

For example, sending a query command for cache line B may result in acquiring a resource (e.g., controller, state machine) that is required by the L3 to complete a data transfer to cache line A. In this case, a deadlock would result because the data transfer to cache line A cannot be completed, which then also means that the subsequent data transfer to cache line B cannot occur. This is why query for a cache line is avoided until data transfer associated with another cache line is completed or ready to be completed. The preinstall command, by contrast, cannot result in potentially necessary resources being tied up, because, while the data from the cache line is obtained by the L3, other resources are not obtained, and ownership of the cache line is not retained by the L3 until the completion of data transfer based on a preinstall command. As a result, in the previous example, a resource needed to complete data transfer to cache line A cannot be acquired based on a preinstall command for cache line B. However, an advantage of the preinstall command is that, when a subsequent query command it sent, the L3 can indicate readiness to receive the data in a shorter time.

With reference now to FIG. 1, portions of an exemplary mainframe computer 100 configured to perform the preinstall of partial store cache lines according to embodiments of the invention are shown. Various components of the mainframe computer 100 are known and not shown or discussed herein. FIG. 1 provides an overview of portions of the mainframe computer 100 relevant to one or more embodiments of the invention. An exemplary mainframe computer 100 includes multiple drawers 101 (e.g., 4 drawers 101) that each include clusters 102 (e.g., 2 clusters 102). The clusters 102 are connected to each other via a system controller (SC) 103 that also serves as a fourth level cache (L4), which additionally provides drawer-to-drawer connectivity. Each cluster 102 includes processor chips (CP) 105 (e.g., 2 processor chips 105) that are connected to each other and to the SC 103. Components of a given cluster 102 may communicate with components of other clusters 102 via broadcasts by the associated SC 103 chips, for example.

Each CP 105 includes processor cores 104 (e.g., 10 processor cores 104) and different levels of cache including L3 cache 120 (i.e., a memory subsystem of the mainframe computer 100), which is specifically discussed herein. Each CP 105 includes a memory port to actual memory 150 (e.g., dynamic random-access memory (DRAM)). Each CP 105 also includes L3 cache 120 and PBCs 110 (e.g., 2 PBCs or host bridges) to provide connectivity outside the mainframe computer 100. That is, each CP 105 includes a memory port to memory 150 associated with its corresponding drawer 101. The L3 cache 120 of a given cluster 102 may access not only the memory 150 associated with its corresponding cluster 102 or drawer 101 but also other memory 150 associated with other drawers 101 through the SC 103 chips. As such, the L3 cache 120 associated with each of the clusters 102 of each of the drawers 101 shown in FIG. 1 can access the same memory 150. Cache lines of interest may also be part of an L3 cache 120 rather than a memory 150. This means that a given L3 cache 120 may need to install a local cache line (a cache line that resides in the L3 cache 120 itself or memory 150 associated with the cluster 102 of the L3 cache line 120) or a cache line from an L3 cache 120 or memory 150 that is associated with another cluster 102 of the drawer 101 or even another drawer 101 entirely. As previously noted, access to the memory 150 associated with a different cluster 102 or drawer 101 would require communication through one or more SC 103 chips.

Figure 2:
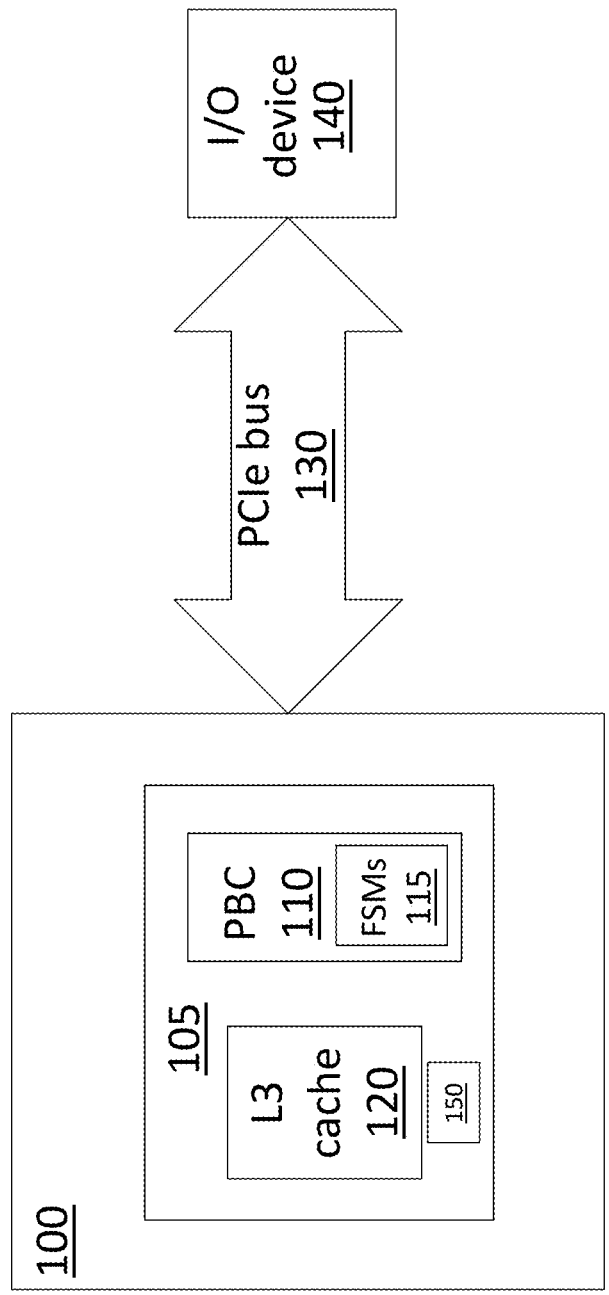
FIG. 2 is a block diagram of a processor chip according to embodiments of the invention.

FIG. 2 is a block diagram of the mainframe computer 100 according to embodiments of the invention. As discussed with reference to FIG. 1, a PBC 110 is connected to the L3 cache 120. The PBC 110 obtains data from an external I/O device 140 into system memory. Although one I/O device 140 is shown in FIG. 2, a number of I/O devices 140 can communicate with the mainframe computer 100 and with the PBC 110 in particular. A PCIe bus 130 facilitates communication between the mainframe computer 100, specifically the PBC 110, and the I/O device 140. As previously noted, in the exemplary case, the difference in architecture of the mainframe computer 100 and PCIe bus 130 architecture gives rise to the partial store issue that necessitates the preinstall command according to one or more embodiments. A partial store can also result when data from the I/O device 140 includes scattered data fragments that are not line-based, for example. According to the exemplary case, the cache line used by the PCIe bus 130 (e.g., 64 bytes) is smaller than the cache line used within the mainframe computer 100 (e.g., 256 bytes). As a result, the PBC 110 buffers data packets received via the PCIe bus 130, up to 64 bytes at a time, for example, and ultimately writes the data to the target cache line via the L3 cache 120.

Figure 3:
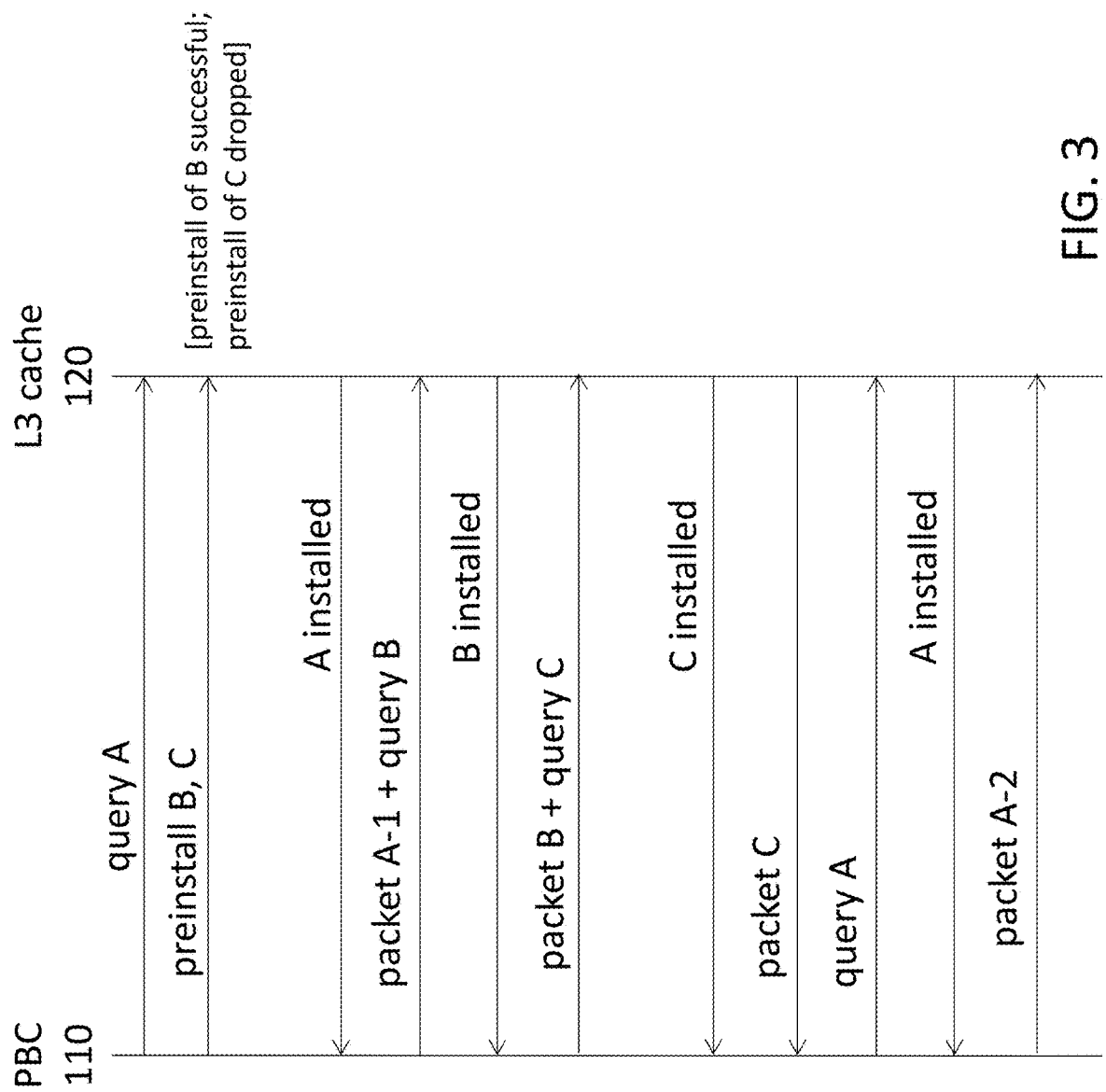
FIG. 3 shows communication including a preinstall command according to embodiments of the invention.

Specifically, the PBC 110 has store FSMs 115 (e.g., 16 FSMs 115) with a corresponding dependency matrix to facilitate ordering of the store FSMs 115. FSMs 115 can be implemented in programmable logic devices, logic gates, flip flops, and in other known hardware devices. Each ordered store of data that comes into the PBC 110 results in an update of the dependency matrix to ensure that the newly incoming store waits for all preceding stores. As previously noted, stores are ordered based on an originator identifier in the PBC 110. That is, the PBC 110 may receive a 192-byte packet (packet A-1) representing three 64-byte cache lines received over the PCIe bus 130, and packet A-1 may target cache line A. Cache line A may be a cache line in a memory 150 within the same drawer 101, for example. This may be followed by a 64-byte packet (packet B) targeting cache line B (a cache line in memory 150 associated with a different drawer 101). A 74-byte packet (packet C) targeting cache line C (a cache line in an L3 cache 120 of a different cluster 102) may be received next, followed by a 37-byte packet (packet A-2) targeting cache line A again. Each of the received packets is organized into a different slot in the PBC 110 for transfer to the L3 cache 120, which writes the data to the targeted cache line. As detailed with reference to FIG. 4, a number of different conditions may trigger the PBC 110 to send the preinstall command to the L3 cache 120. Essentially, the preinstall command facilitates a potential time savings when the PBC 110 has stored data targeted for more than one cache line. FIG. 3 shows exemplary commands issued based on the four previously discussed exemplary packets (A-1, B, C, A-2).

FIG. 3 is a process flow of communication between the PBC 110 and the associated L3 cache 120 of the same CP 105 according to embodiments of the invention. As previously noted, prior to the communication shown in FIG. 3, data, in the form of the packets A-1, B, C, A-2, from the PCIe adapter 130 is stored in one or more store FSMs 115 of the PBC 110. When packet A-1 targeting cache line A arrives, the PBC 110 sends a query "query A" command to the L3 cache 120 to install cache line A (i.e., store the data from cache line A in the local cache of the L3 cache 120 and obtain ownership). While this query is processed by the L3 cache 120 and the PBC 110 awaits a response, the PBC 110 sends preinstall commands for cache line B and cache line C "preinstall B, C." The preinstall commands are requests that the L3 cache 120 obtain the data from cache line B and cache line C into its local cache without taking ownership.

As FIG. 3 indicates, the preinstall of B is successful, but the preinstall of C is dropped. That is, an address conflict occurs when the L3 cache 120 attempts to install the cache line for cache line C (i.e., obtain memory addresses for cache line C) according to the exemplary case. In both the case of the successful preinstall of cache line B and the unsuccessful install of cache line C, the L3 cache 120 does not send any response to PBC 110. During a successful preinstall, the L3 cache 120 fetches the cache line in an exclusive state (i.e., with ownership) to facilitate subsequently writing to that line.

L3 cache 120 sends a response or "A installed" message to the PBC 110 indicating that cache line A has been installed (i.e., data from cache line A is in local cache and the L3 cache 120 has ownership to write to cache line A) and ordering dependency is resolved such that any data sent to cache line A will be serialized correctly. Based on this response, the PBC 110 sends the data in cache line A and also a query for cache line B indicated as "packet A-1+query B" in FIG. 3. Because of the successful preinstall of cache line B based on the preinstall command from the PBC 110, the L3 cache 120 sends a "B installed" message more quickly than it might have if cache line B had to be installed upon receiving the "query B" command from the PBC 110. This is indicated by the relative spacing of the messages in FIG. 3. That is, the data from cache line B is already in the local cache of the L3 cache 120 and the L3 cache 120 need only ensure ownership to lock out any other L3 cache 120 from writing to the cache line B at the same time and obtain any additional resources.

Along with the data in cache line B, the PBC 110 sends a query for cache line C as indicated by the "packet B+query C" message from the PBC 110 to the L3 cache 120. Because the command to preinstall cache line C was dropped due to an address conflict, cache line C must be installed upon receiving the "query C" command. This delays the "C installed" command from the L3 cache 120 to the PBC 110 as compared to the case when the cache line C could have been preinstalled as the cache line B was. Upon receiving the message from the L3 cache 120, the PBC 110 sends "packet C" or data for cache line C to the L3 cache 120. As a comparison of the transfer process for packet B and packet C in FIG. 3 illustrates, a successful preinstall of a cache line saves time when a query for that cache line is subsequently received. As a result, the preinstall increases throughput when partial stores are involved.

Following the transfer of packet C, the PBC 110 sends another "query A" command in order to transfer packet A-2 to the L3 cache 120. The L3 cache 120 may or may not have retained ownership of cache line A based on the first query command. The data from cache line A may or may not be in the local cache of the L3 cache 120, as well. Thus, the second "query A" command shown in FIG. 3 may mean that the L3 cache 120 obtains the data from cache line A and obtains ownership and any other needed resources anew. Based on the timing of the receipt of packet A-2, a preinstall command for cache line A may be sent, as it was for cache line B and cache line C. The preinstall command would ensure that at least the obtaining of data from cache line A could be avoided based on the second "query A" command.

Figure 4:
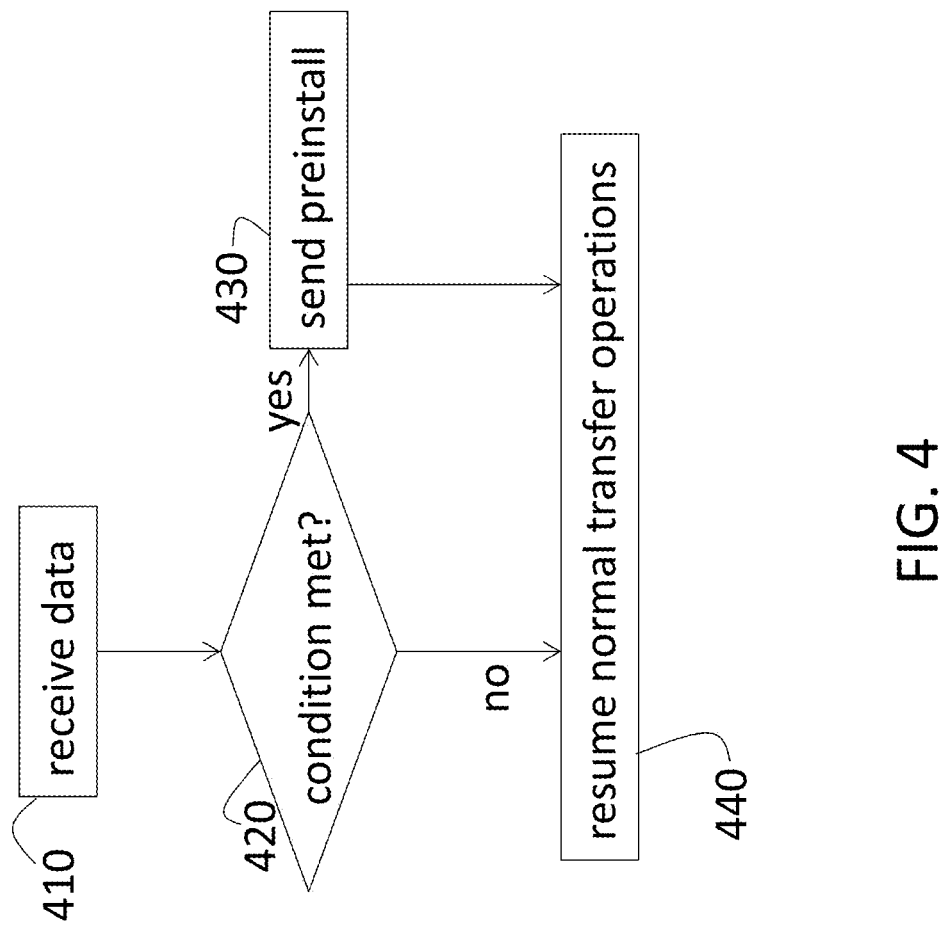
FIG. 4 is a process flow of a method of transferring an ordered partial store of data according to embodiments of the invention.

FIG. 4 is a process flow of a method of transferring an ordered partial store of data according to embodiments of the invention. The ordered data set in partial stores are in FSMs 115 of the PBC 110 and are transferred to L3 cache 120 according to the processes shown in FIG. 4. Receiving data, at block 410, refers to an ordered partial store entering the PBC 110. The data may be received by the PBC 110 in the form of one or more packets targeting one or more cache lines, as discussed with reference to FIG. 3, for example. The data is stored in buffers of the PBC 110 (the store FSMs 115). According to an exemplary embodiment, the data is received through a PCIe adapter 130 from an I/O device 140.

At block 420, a check is done of whether a condition is met to warrant the issuance of one or more preinstall commands. The condition essentially assesses whether the queue depth (i.e., number of partial data stores (e.g., packets) in the queue awaiting transfer by the L3 cache 120) is greater than a threshold. The number of ordered partial stores in the buffers of the PBC 110 may exceed a specified value, for example. This threshold indicates that the query for the newly arrived partial store would take long enough to warrant issuing the request to preinstall. That is, the potential reduction in latency afforded by the preinstall must be balanced against the additional overhead required to send the preinstall command. Thus, a preinstall may not be worth the overhead resources when only one other partial store is in the queue to ultimately be written to the targeted cache line by the L3 cache 120. Determining the condition may be based on testing or trial, and the condition may be modified, as needed. When the condition is met, the store FSM 115 associated with the incoming data is determined to be eligible to send a preinstall command.

At block 430, sending the preinstall command from the PBC 110 to the L3 cache 120 results in a cache line being installed with an exclusive state. Resuming normal transfer operations, at block 440, refers to the PBC 110 sending a query and the L3 cache 120 sending a response to the query to indicate that FSM 115 of the PBC 110 can send the data. The preinstall command does not replace the query or any other operation but, instead, can increase the throughput of ordered partial stores as previously detailed. This is because a successful preinstall means that the L3 cache 120 already installed the associated cache line by the time the query is received.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of transferring an ordered partial store of data from a controller to a memory subsystem, the method comprising:
    receiving the ordered partial store of data into a buffer of the controller;
    issuing a preinstall command to the memory subsystem, wherein the preinstall command indicates that data from a number of addresses of memory corresponding with a target memory location be obtained in local memory of the memory subsystem along with ownership of the target memory location for subsequent use, the ownership based on the preinstall command being non-exclusive ownership that can be dropped prior to the transferring of the ordered partial store of data to the target memory location;
    issuing a query command to the memory subsystem, wherein the query command requests an indication from the memory subsystem that the memory subsystem is ready to receive and correctly serialize the ordered partial store of data, the indication also indicating exclusive ownership of target memory location, which is ownership that is retained until the transferring of the ordered partial store of data to the target memory location is complete; and
    transferring the ordered partial store of data from the controller to the memory subsystem.

2. The method according to claim 1, further comprising the memory subsystem dropping the preinstall command without obtaining the data from the target memory location or the ownership of the data.

3. The method according to claim 1, wherein the controller issuing the preinstall command is based on a condition being met.

4. The method according to claim 3, wherein meeting the condition includes a number of the ordered partial stores of data awaiting transfer to corresponding target memory locations exceeding a threshold number.

5. The method according to claim 1, wherein the receiving the ordered partial store of data is through a peripheral component interface express (PCIe) bus.

6. The method according to claim 5, wherein the receiving the ordered partial store of data through the PCIe bus is from a device.

7. The method according to claim 1, further comprising the memory subsystem sending, to the controller, the indication that the memory subsystem is ready to receive and correctly serialize the ordered partial store of data.

8. The method according to claim 7, wherein the memory subsystem sending the indication is prior to the controller transferring the ordered partial store of data.

9. The method according to claim 1, wherein the receiving the ordered partial store of data into the buffer includes receiving the ordered partial store of data into a store finite state machine (FSM).

10. The method according to claim 9, wherein the issuing the preinstall command includes the store FSM issuing the preinstall command to the memory subsystem.

11. A system to transfer an ordered partial store of data, the system comprising:

a memory subsystem configured to store an ordered partial store of data and transfer the ordered partial store of data to a target memory location; and a controller configured to receive the ordered partial store of data into a buffer, issue a preinstall command to the memory subsystem, wherein the preinstall command indicates that data from a number of addresses of memory corresponding with the target memory location be obtained in a local memory of the memory subsystem along with ownership of the target memory location, the ownership based on the preinstall command being non-exclusive ownership that can be dropped prior to the transfer of the ordered partial store of data to the target memory location, to issue a query command to the memory subsystem, wherein the query command requests an indication that the memory subsystem is ready to receive and correctly serialize the ordered partial store of data, the indication also indicating exclusive ownership of target memory location, which is ownership that is retained until the transfer of the ordered partial store of data to the target memory location is complete, and to transfer the ordered partial store data from the buffer to the memory subsystem.

12. The system according to claim 11, wherein the memory subsystem drops the preinstall command without obtaining the data from the target memory location or the ownership of the data.

13. The system according to claim 11, wherein the controller issues the preinstall command based on a condition being met.

14. The system according to claim 13, wherein the condition includes a number of the ordered partial stores of data awaiting transfer to corresponding target memory locations exceeding a threshold number.

15. The system according to claim 11, wherein the controller receives the ordered partial store of data is through a peripheral component interface express (PCIe) adapter.

16. The system according to claim 15, wherein the controller receives the ordered partial store of data through the PCIe adapter from a device.

17. The system according to claim 11, wherein the memory subsystem sends the indication, to the controller, that the memory subsystem is ready to receive and correctly serialize the ordered partial store of data.

18. The system according to claim 17, wherein the memory subsystem sends the indication prior to the controller transferring the ordered partial store of data from the buffer to the memory subsystem.

19. The system according to claim 11, wherein the buffer is implemented as a store finite state machine (FSM).

20. The system according to claim 19, wherein the store FSM issues the preinstall command to the memory subsystem.

* * * * *